(12) United States Patent
Noguchi et al.

(10) Patent No.: US 6,994,921 B2
(45) Date of Patent: Feb. 7, 2006

(54) POLYMERIC FLUORESCENT SUBSTANCE AND POLYMER LIGHT EMITTING DEVICE

(75) Inventors: Takanobu Noguchi, Tsukuba (JP); Masato Ueda, Tsukuba (JP); Masamitsu Ishitobi, Tsukuba (JP)

(73) Assignee: Sumitomo Chemical Company, Osaka (JP)

( * ) Notice: Subject to any disclaimer, the term of this patent is extended or adjusted under 35 U.S.C. 154(b) by 0 days.

(21) Appl. No.: 09/928,348

(22) Filed: Aug. 14, 2001

(65) Prior Publication Data

US 2002/0076577 A1 Jun. 20, 2002

(30) Foreign Application Priority Data

Aug. 21, 2000 (JP) .............................. 2000-249398

(51) Int. Cl.
*H05B 33/14* (2006.01)
*C09K 11/06* (2006.01)
*C08G 61/00* (2006.01)

(52) U.S. Cl. ............ 428/690; 428/917; 313/504; 257/40; 257/103; 252/301.16; 252/301.35; 528/31; 528/43; 528/373; 528/425

(58) Field of Classification Search ............... 428/690, 428/917; 313/504, 506; 257/40, 103; 252/301.16, 252/301.35; 526/279, 286, 310, 316, 326, 526/334; 528/31, 40, 43, 397, 422, 425, 528/373
See application file for complete search history.

(56) References Cited

U.S. PATENT DOCUMENTS 5,817,430 A 10/1998 Hsieh ......................... 428/690
5,874,179 A 2/1999 Kreuder et al. ............. 428/690
5,980,781 A 11/1999 Doi et al. ............... 252/301.16
6,329,086 B1 * 12/2001 Shi et al. .................... 428/690
6,521,359 B1 * 2/2003 Noguchi et al. ............ 428/690
2002/0193551 A1 * 12/2002 Pei .............................. 528/86

FOREIGN PATENT DOCUMENTS

| EP | 0825242 A | 2/1998 |
| EP | 1043382 A | 10/2000 |
| EP | 1116768 A | 7/2001 |

OTHER PUBLICATIONS

H. A. Reisch et al., Novel phenoxy and thiophenenoxy substituted poly(para-phenylenevinylene)s, Macromol. Chem. Phys. 200, No. 3, (1999), pp. 552-561, no month.
Derwent Publications XP002181984 & JP 10 324870, dated Dec. 8, 1998.
"Polymer Light-emiting Diodes with Single and Double layer Structures . . . " By Yamamoto et al., Japanese. Journal of Applied Physics, vol. 33, No. 2B, Part 2, dated Feb. 15, 1994, pp. L250-L253.
Patent Abstracts of Japan, vol. 006, No. 214, dated Oct. 27, 1982 & JP 57 119905 dated Jul. 26, 1982.

\* cited by examiner

*Primary Examiner*—Marie Yamnitzky
(74) *Attorney, Agent, or Firm*—Sughrue Mion, PLLC

(57) ABSTRACT

A polymeric fluorescent substance exhibiting strong visible fluorescence in solid state. The substance has a polystyrene reduced number-average molecular weight of $1\times10^3$ to $1\times10^8$, and contains repeating units represented by formula (1), $$-Ar_1-(CR_1=CR_2)_m- \quad (1)$$

in the formula, $Ar_1$ represents an arylene group having a specific substituent. By using the polymeric fluorescent substance, a high performance polymer LED can be prepared easily.

6 Claims, No Drawings

POLYMERIC FLUORESCENT SUBSTANCE AND POLYMER LIGHT EMITTING DEVICE

BACKGROUND OF THE INVENTION

1. Field of the Invention

The present invention relates to a polymeric fluorescent substance, a polymer light-emitting device (hereinafter, referred to as polymer LED), and a device using the same.

2. Description of Related Art

Inorganic electroluminescence devices (hereinafter, sometimes referred to as inorganic EL device) using an inorganic luminescent material as a light-emitting material have been used, for example, for sheet light sources as back-lights and displays such as a flat panel display and the like. However, an alternating current of high voltage has been required for light emission.

Recently, there has been reported an organic electroluminescence device (hereinafter, sometimes referred to as organic EL device) having a double-layer structure in which an organic fluorescent dye as a light-emitting layer is laminated with an organic charge transport compound used in a photosensitive layer for electrophotography and the like (Japanese Patent Application Laid-Open (JP-A) No. 59-194393). Organic EL devices have characteristics that light emissions of a lot of colors are obtained easily in addition to low voltage driving and high luminance as compared with inorganic EL devices. Therefore, a lot of trials have been reported regarding device structures, organic fluorescent dyes and organic charge transport compounds of organic EL devices [Jpn. J. Appl. Phys., 27, L269 (1988), J. Appl. Phys., 65, 3610 (1989)].

Further, in addition to organic EL devices using mainly organic compounds having a lower molecular weight, polymer light-emitting devices using light-emitting materials having a higher molecular weight have been proposed in such as WO 9013148, JP-A No. 3-244630, Appl. Phys. Lett., 58, 1982 (1991). WO9013148 discloses in the examples thereof an EL device using a thin film of poly(p-phenylene vinylene) obtained by forming a film of a soluble precursor on the electrode and subjecting it to a heat treatment to convert the precursor into a conjugated polymer.

Further, JP-A 3-244630 contains examples of conjugated polymers which are themselves soluble in a solvent and needs no heat treatment. Also, in Appl. Phys. Lett., 58, 1982 (1991), a polymeric light-emitting materials soluble in a solvent and a polymer LED fabricated using the same are described.

An object of the present invention is to provide a polymeric fluorescent substance emitting strong fluorescence, and to provide a high performance polymer LED which can be easily manufactured.

SUMMARY OF THE INVENTION

The above object and other objectives have been achieved by the present inventors who have intensively studied, in view of the above-mentioned conditions, and found that a polymeric fluorescent substance having a specific amount of a repeating unit having a specific substituent in the side chain as described herein exhibit particularly strong visible fluorescence in solid state, and that a high performance polymer LED which can be prepared easily and high efficiency can be obtained by using this polymeric fluorescent substance.

Namely, in accordance with the present invention there is provided a polymeric fluorescent substance exhibiting visible fluorescence in solid state, having a polystyrene reduced number-average molecular weight of $1 \times 10^3$ to $1 \times 10^8$, and containing one or more repeating units of the following formula (1), the amount of the repeating units of formula (1) being from more than 9 mol % to 100 mol % based on the total amount of all repeating units,

$$—Ar_1—(CR_1=CR_2)_m— \quad (1)$$

in the formula, $Ar_1$ represents an arylene group having 6 to 60 carbon atoms participating in the conjugation or a divalent heterocyclic compound group having 2 to 60 carbon atoms participating in the conjugation, each independently carrying at least one substituent represented by the below formula (2); and $Ar_1$ may have one or more substituents, and when plurality of substituents are present on $Ar_1$, they may be the same or different; m represents 0 or 1; $R_1$ and $R_2$ are independently selected from the group consisting of a hydrogen atom, a linear, branched or cyclic alkyl group having 1 to 20 carbon atoms, an aryl group having 6 to 60 carbon atoms, a heterocyclic compound groups having 2 to 60 carbon atoms and a cyano group; and the aryl groups and the heterocyclic compound groups may further have one or more substituents,

$$—X—Ar_2 \quad (2)$$

in the formula, X represents —O—, —S—, —SiR$_3$R$_4$—, —NR$_5$—, —CO—, —COO—, or —SO$_2$—; and R$_3$, R$_4$ and R$_5$ are independently selected from the group consisting of a hydrogen atom, a linear, branched or cyclic alkyl group having 1 to 20 carbon atoms, an aryl group having 6 to 60 carbon atoms, a heterocyclic compound groups having 2 to 60 carbon atoms and cyano group, and the aryl groups and the heterocyclic compound groups may further have one or more substituents; $Ar_2$ represents a heterocyclic compound group having 2 to 60 carbon atoms participating in the conjugation or an aryl group having 6 to 60 carbon atoms participating in the conjugation and having at least one substituent thereon, the heterocyclic compound group may further have one or more substituents thereon; the substituents on the aryl group include linear, branched or cyclic alkyl group having 5 to 20 carbon atoms, alkoxy group carrying a linear, branched or cyclic alkyl group having 1 to 20 carbon atoms, alkylthio group carrying a linear, branched or cyclic alkyl group having 1 to 20 carbon atoms, mono-, di- or tri-alkylsilyl group having 1 to 60 carbon atoms, mono- or di-alkylamino group having 1 to 40 carbon atoms, aryl group having 6 to 60 carbon atoms and having at least one substituent thereon, aryloxy group having 6 to 60 carbon atoms, arylalkyl group having 7 to 60 carbon atoms, arylalkoxy group having 7 to 60 carbon atoms, arylalkenyl group having 8 to 60 carbon atoms, arylalkynyl group having 8 to 60 carbon atoms, mono-arylamino group having 6 to 60 carbon atoms, diarylamino group having 16 to 60 carbon atoms, and heterocyclic compound group having 2 to 60 carbon atoms; in the above substituents, the aryloxy group, aryl alkyl group, aryl alkoxy group, aryl alkenyl group, aryl alkynyl group, mono- or a di-arylamino group, heterocyclic compound group may further have one or more substituents; the portion represented by —CH$_3$ in the substituents on the above $Ar_2$ may be replaced with —SiR$_6$R$_7$R$_8$, the portion represented by —CH$_2$— may be replaced with —O—, —S—, or —SiR$_9$R$_{10}$—, the portion represented by

may be replaced with

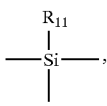

in the above formulas, $R_6$, $R_7$, $R_8$, $R_9$, $R_{10}$, and $R_{11}$ each independently represent a group selected from a linear, branched or cyclic alkyl group having 1 to 20 carbon atoms, an arylene group having 6 to 20 carbon atoms, a heterocyclic compound group having 2 to 20 carbon atoms, and a cyano group; and the aryl group and the heterocyclic compound group may further have one or more substituents; one or more hydrogen atoms of the substituent on the above $Ar_2$ may be substituted with a fluorine atom; when a plurality of the substituents are present on $Ar_2$, they may be the same or different.

The present invention also provides a polymer light emitting device comprising a pair of electrodes composed of an anode and a cathode one or both which is transparent or semitransparent, and one or more light emitting layers placed between the electrodes, wherein the polymeric fluorescent substance described above is contained in said light emitting layer.

The present invention provides a flat light source, a segment display, and a dot matrix display all obtained by using the polymer light emitting device. The present invention also provides a liquid crystal display obtained by using the polymer light emitting device as a back-light.

DETAILED DESCRIPTION OF THE PREFERRED EMBODIMENTS

The polymeric fluorescent substance of the present invention, and a polymer LED obtained by using the polymeric fluorescent substance will be described in detail below.

The polymeric fluorescent substance of the present invention is a polymeric fluorescent substance exhibiting visible fluorescence in solid state, and having a polystyrene reduced number-average molecular weight of $1 \times 10^3$ to $1 \times 10^8$. The polymeric fluorescent substance contains one or more repeating units of the above-mentioned formula (1) and the amount of the repeating units of formula (1) being from more than 9 mol % to 100 mol % based on the total amount of all repeating units. The amount of the repeating units of formula (1) is preferably not less than 20 mol %, and more preferably not less than 50 mol %.

In the formula (1), $Ar_1$ represents an arylene group having 6 to 60 carbon atoms participating in the conjugation or a divalent heterocyclic compound group having 2 to 60 carbon atoms participating in the conjugation, each independently carrying at least one substituent represented by the above formula (2); and $Ar_1$ may have one or more substituents, and when plurality of substituents are present on $Ar_1$, they may be the same or different; m represents 0 or 1; $R_1$ and $R_2$ are independently selected from the group consisting of a hydrogen atom, a linear, branched or cyclic alkyl group having 1 to 20 carbon atoms, an aryl group having 6 to 60 carbon atoms, a heterocyclic compound groups having 2 to 60 carbon atoms and a cyano group; and the aryl groups and the heterocyclic compound groups may further have one or more substituents.

$Ar_1$ can be selected so as not to deteriorate the fluorescence property of the polymeric fluorescent substance, and exemplified are divalent groups below described chemical formulas 1 to 14.

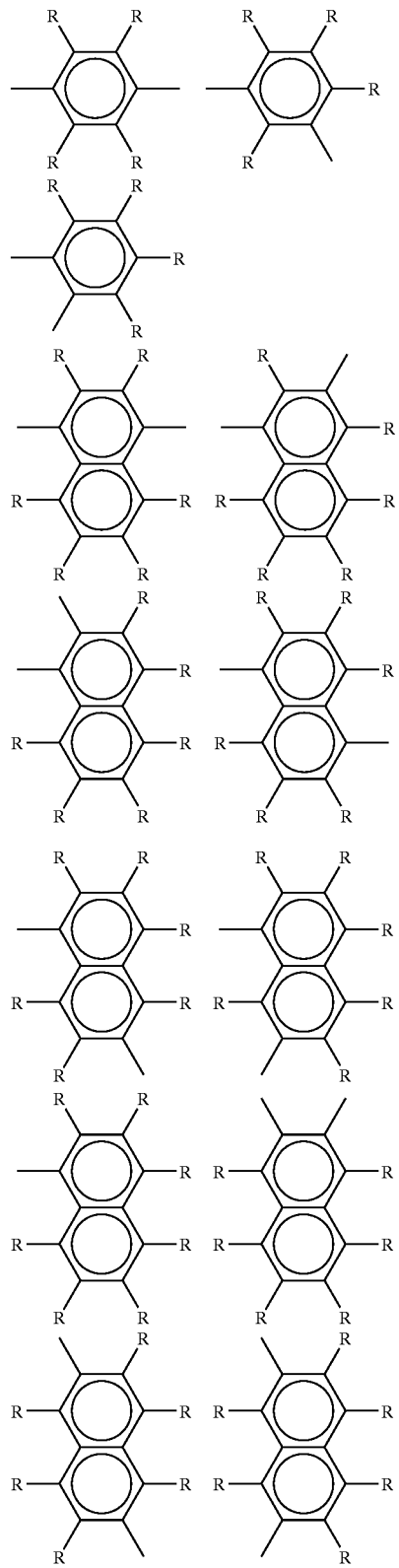

Formula 2

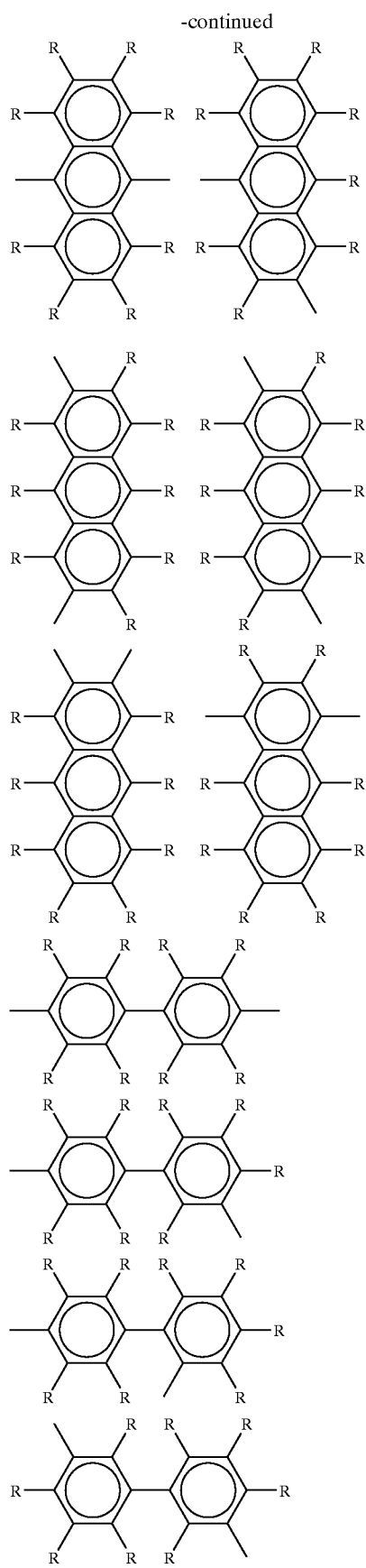
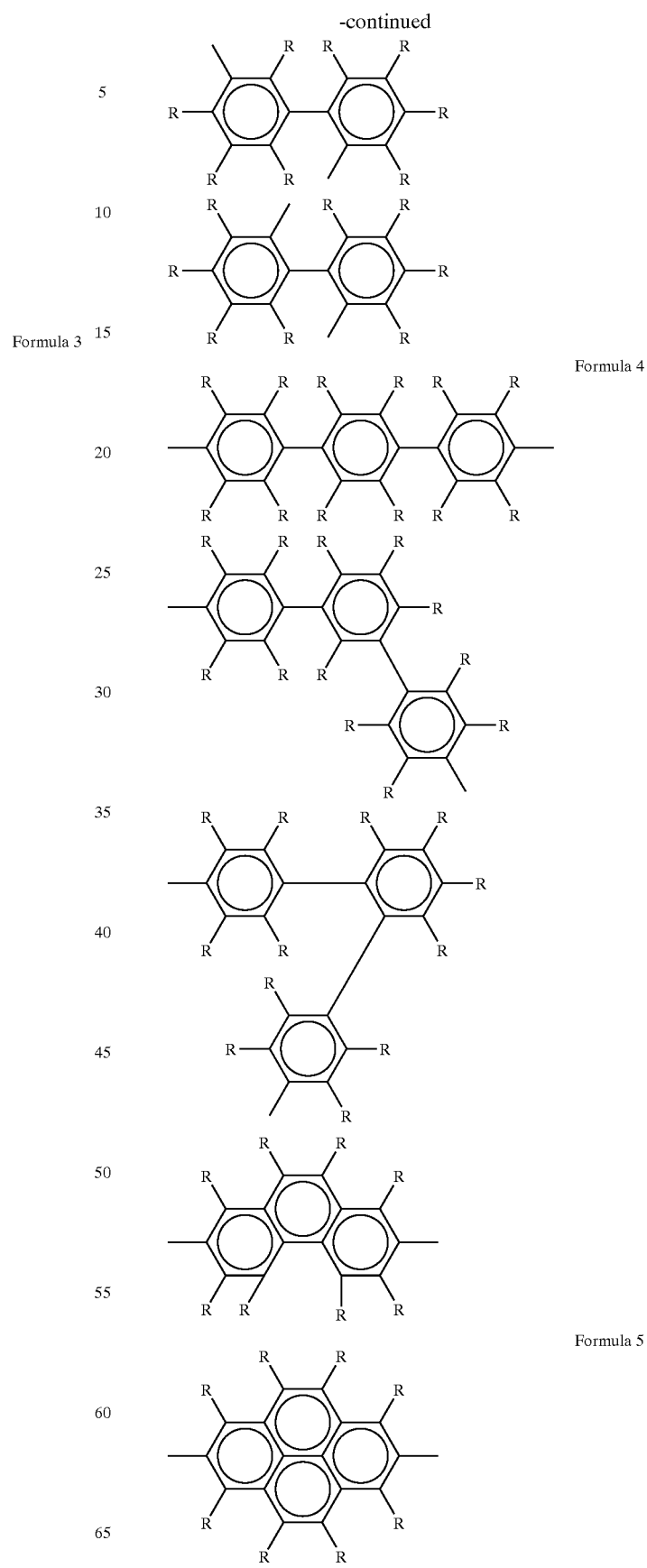
Formula 3
Formula 4
Formula 5

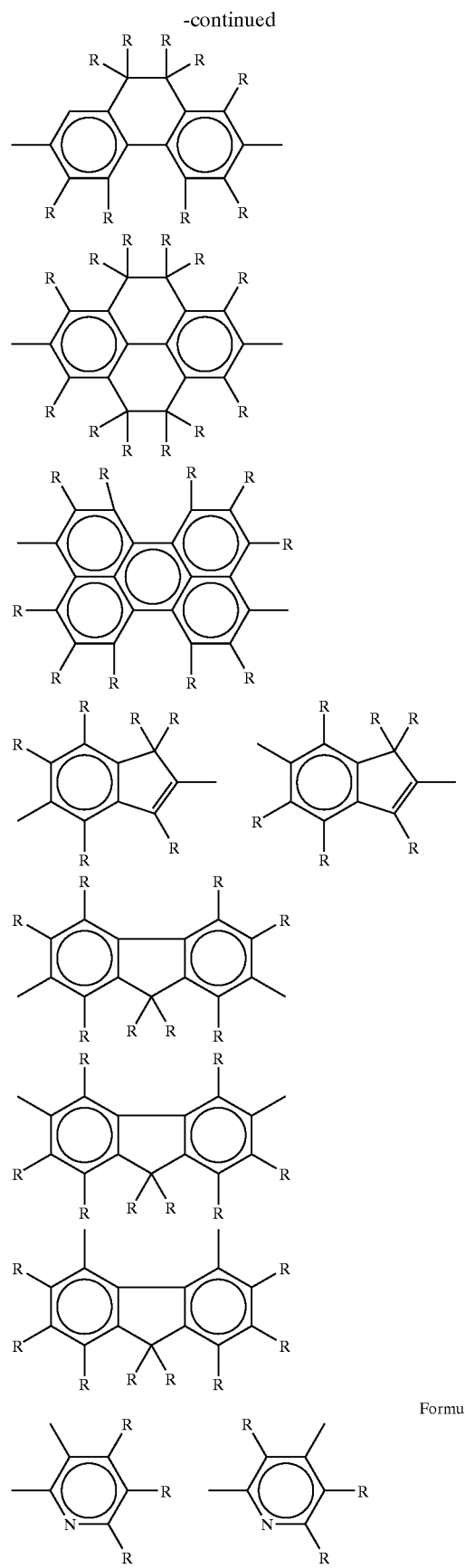
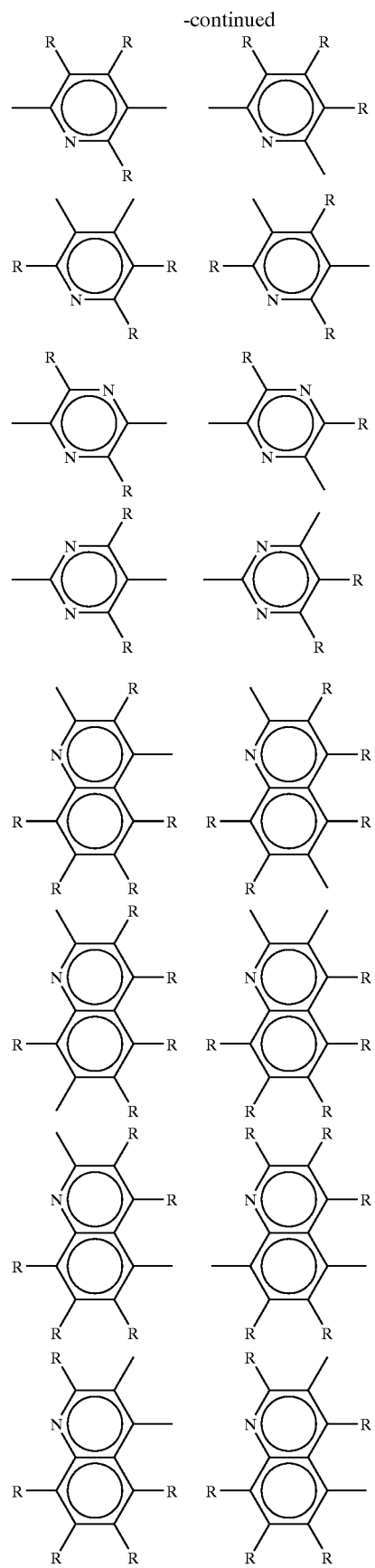
Formula 6
Formula 7

-continued
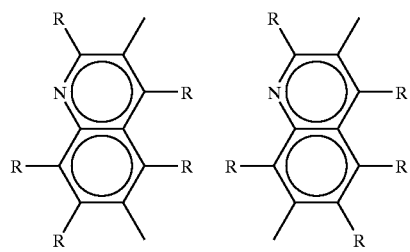
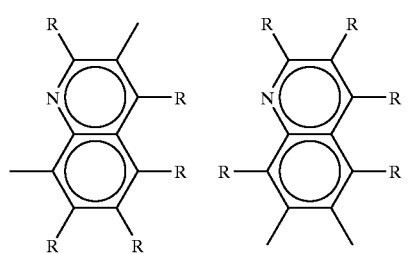
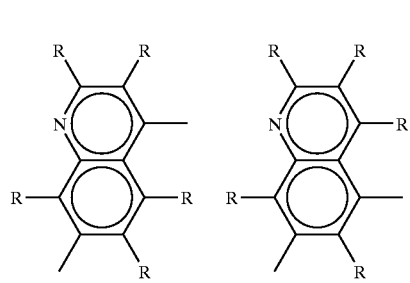
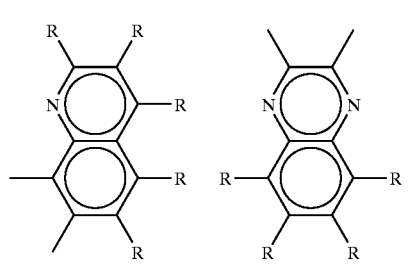
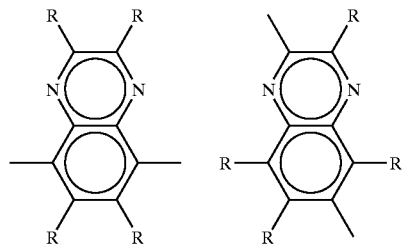
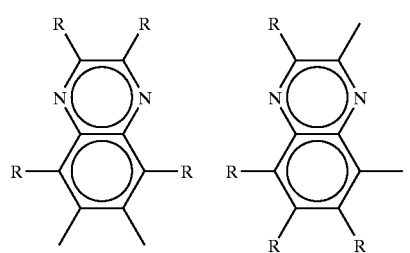
-continued
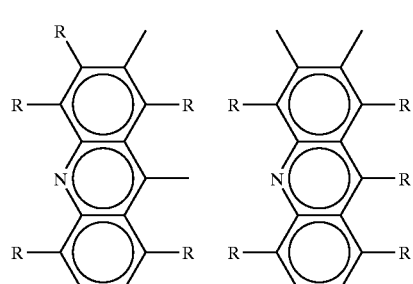
Formula 9
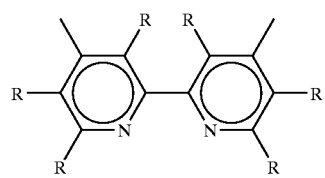
Formula 10
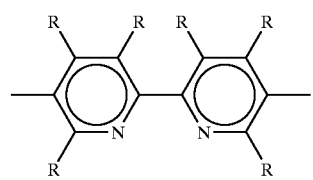
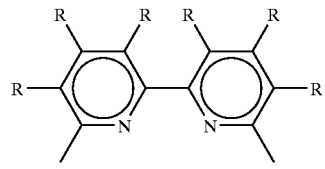
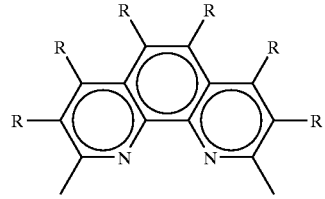
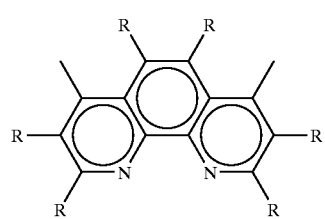

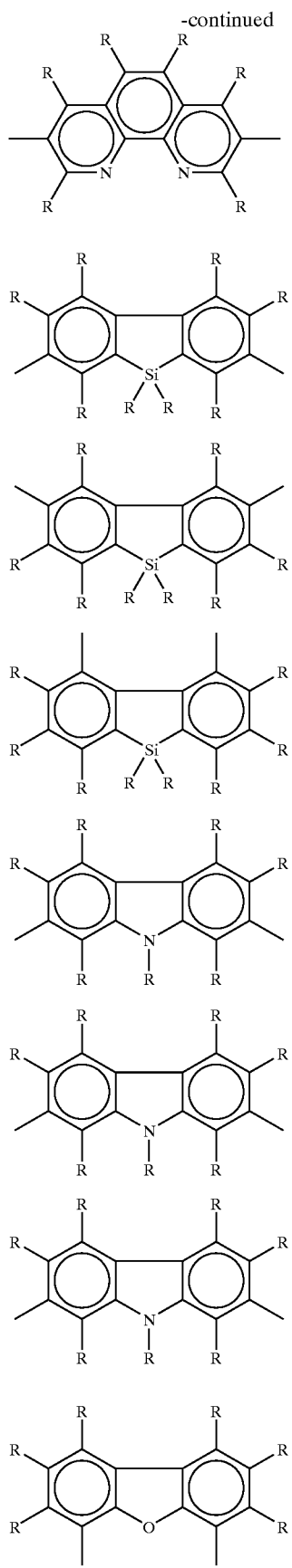
Formula 11
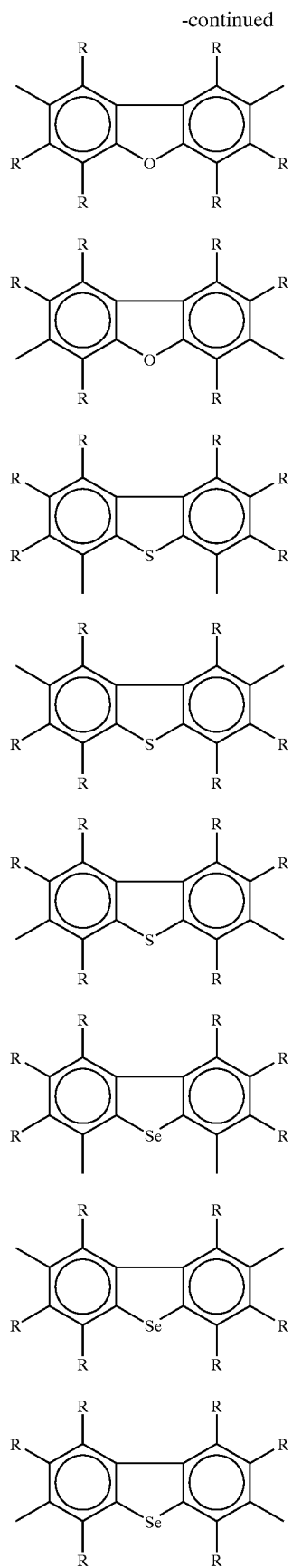
Formula 12

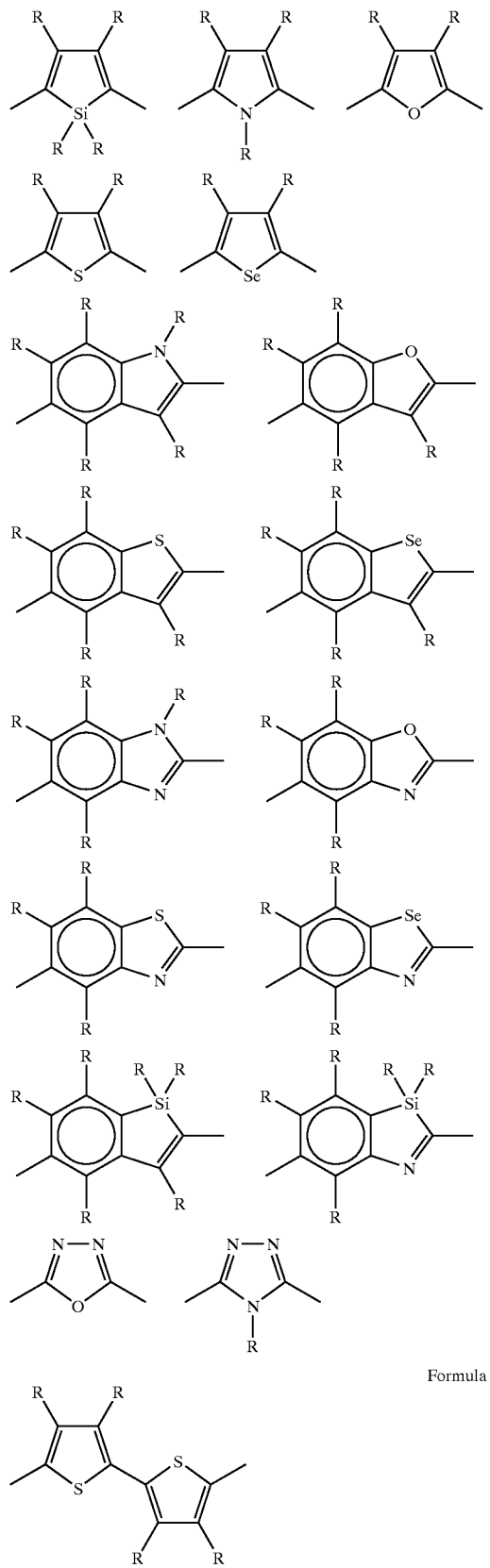
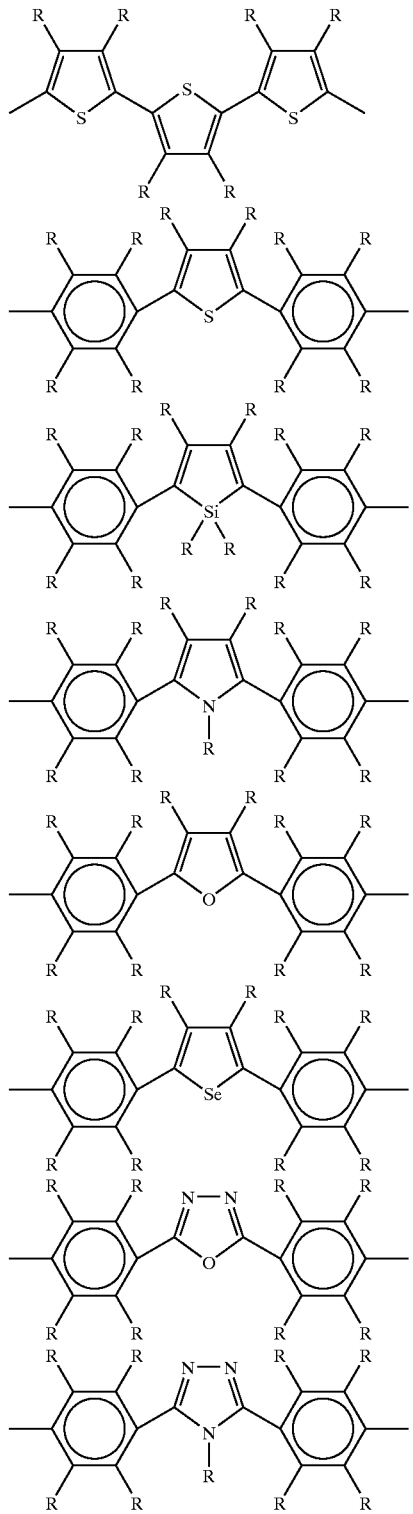
In the above examples of $Ar_1$, at least one R is the substituent represented by the above formula (2).
R other than the groups represented by formula (2) includes a hydrogen atom, linear, branched, or cyclic alkyl groups having 1 to 20 carbon atoms; linear, branched, or cyclic alkoxy groups having 1 to 20 carbon atoms; linear, branched, or cyclic alkylthio groups having 1 to 20 carbon atoms: mono-, di-, or tri-alkylsilyl groups having 1 to 60 carbon atoms; mono-, or di-alkylamino group having 1 to 40 carbon atoms; aryl groups having 6 to 60 carbon atoms; aryloxy groups having 6 to 60 carbon atoms; arylalkyl groups having 7 to 60 carbon atoms; arylalkoxy groups having 7 to 60 carbon atoms; arylamino groups having 6 to 60 carbon atoms; heterocyclic compound groups having 2 to 60 carbon atoms or cyano group. The aryl group, aryloxy group, arylalkyl group, arylalkoxy group and arylamino group may further have one or more substituents.

Carbon atoms in the group represented by above R are possibly replaced by oxygen atom or sulfur atom, one or more hydrogen atoms in R group may be replaced by fluorine atom.

In the above examples, a plurality of Rs are present in one structural formula, they may be the same or different, and they are selected independently each other. When $Ar_1$ has a plurality of substituents, they may be the same or different. For enhancing the solubility into a solvent, it is preferable that at least one substituent other than a hydrogen atom is carried, and it is also preferable that the form of repeating units including substituents has less symmetric property.

$Ar_2$ in the above formula (2) represents a heterocyclic compound group having 2 to 60 carbon atoms participating in the conjugation or an aryl group having 6 to 60 carbon atoms participating in the conjugation and having at least one substituent thereon. The heterocyclic compound group may further have one or more substituents. The substituents on the aryl group include linear, branched or cyclic alkyl group having 5 to 20 carbon atoms, alkoxy group carrying a linear, branched or cyclic alkyl group having 1 to 20 carbon atoms, alkylthio group carrying a linear, branched or cyclic alkyl group having 1 to 20 carbon atoms, mono-, di- or tri-alkylsilyl group having 1 to 60 carbon atoms, mono- or di-alkylamino group having 1 to 40 carbon atoms, aryl group having 6 to 60 carbon atoms and having at least one substituent thereon, aryloxy group having 6 to 60 carbon atoms, arylalkyl group having 7 to 60 carbon atoms, arylalkoxy group having 7 to 60 carbon atoms, arylalkenyl group having 8 to 60 carbon atoms, arylalkynyl group having 8 to 60 carbon atoms, mono-arylamino group having 6 to 60 carbon atoms, diarylamino group having 16 to 60 carbon atoms, and heterocyclic compound group having 2 to 60 carbon atoms. In the above substituents, the aryloxy group, aryl alkyl group, aryl alkoxy group, aryl alkenyl group, aryl alkynyl group, mono- or a di-arylamino group, heterocyclic compound group may further have one or more substituents.

The portion represented by —$CH_3$ in the substituents on the above $Ar_2$ may be replaced with —$SiR_6R_7R_8$, the portion represented by —$CH_2$— may be replaced with —O—, —S—, or —$SiR_9R_{10}$—, the portion represented by

may be replaced with

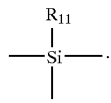

$R_6$, $R_7$, $R_8$, $R_9$, $R_{10}$, and $R_{11}$ each independently represent a group selected from a linear, branched or cyclic alkyl group having 1 to 20 carbon atoms, an arylene group having 6 to 20 carbon atoms, a heterocyclic compound group having 2 to 20 carbon atoms, and a cyano group. The aryl group and the heterocyclic compound group may further have one or more substituents. One or more hydrogen atoms of the substituent on the above $Ar_2$ may be substituted with a fluorine atom. When a plurality of the substituents are present on $Ar_2$, they may be the same or different.

In case of $Ar_2$ represents a heterocyclic compound group, examples of the substituents which may be present on $Ar_2$ include linear, branched or cyclic alkyl groups having 1 to 20 carbon atoms, alkoxy group carrying a linear, branched or cyclic alkyl group having 1 to 20 carbon atoms, alkylthio group carrying a linear, branched or cyclic alkyl group having 1 to 20 carbon atoms, mono-, di- or tri-alkylsilyl group having 1 to 60 carbon atoms, mono- or di-alkylamino group having 1 to 40 carbon atoms, aryl group having 6 to 60 carbon atoms, aryloxy group having 6 to 60 carbon atoms, arylalkyl group having 7 to 60 carbon atoms, arylalkoxy group having 7 to 60 carbon atoms, arylalkenyl group having 8 to 60 carbon atoms, arylalkynyl group having 8 to 60 carbon atoms, mono-arylamino group having 6 to 60 carbon atoms, diarylamino group having 16 to 60 carbon atoms, and heterocyclic compound group having 2 to 60 carbon atoms. In the above substituents, the aryl group, aryloxy group, arylalkyl group, arylalkoxy group, arylalkenyl group, arylalkynyl group, mono- or di-arylamino group, and heterocyclic compound group may further have one or more substituents.

In formula (2), X represents —O—, —S—, —$SiR_3R_4$—, —$NR_5$—, —CO—, —COO—, or —$SO_2$—. $R_3$, $R_4$ and $R_5$ are independently selected from the group consisting of a hydrogen atom, a linear, branched or cyclic alkyl group having 1 to 20 carbon atoms, an aryl group having 6 to 60 carbon atoms, a heterocyclic compound groups having 2 to 60 carbon atoms or cyano group, and the aryl groups and the heterocyclic compound groups may further have one or more substituents.

Next, examples of the aryl groups and heterocyclic compound groups in $Ar_2$ will be described.

Examples of the aryl groups having 6 to 60 carbon atoms include phenyl group, naphthyl group, anthryl group, pyrenyl group, perirenyl group, and the like. Phenyl group and naphthyl group are suitable, and phenyl group is more suitable.

Examples of the aryl groups having 6 to 60 carbon atoms include phenyl group, naphthyl group, anthryl group, pyrenyl group, peryrenyl group, and the like. Phenyl group, and naphthyl group are suitable, and phenyl group is more suitable.

Next, examples of R other than the substituents represented by formula (2) in $Ar_1$, and the substituents of $Ar_2$ will be described.

Examples of the linear, branched or cyclic alkyl groups having 1 to 20 carbon atoms represented by R of $Ar_1$, and examples of the linear, branched or cyclic alkyl group having 5 to 20 carbon atoms of the substituents on $Ar_2$ include methyl group, ethyl group, n-propyl group, iso-propyl group, n-butyl group, iso-butyl group, tert-butyl group, pentyl group, hexyl group, heptyl group, octyl group, nonyl group, decyl group, lauryl group, cyclopropyl group, cyclobutyl group, cyclopentyl group, cyclohexyl group, cycloheptyl group, cyclooctyl group, cyclononyl group, cyclododecyl group, and the like. Pentyl group, hexyl group, octyl group, decyl group, and cyclohexyl group are suitable. Alkyl groups having no prefix such as n- or iso-, include all the isomers of linear and branched alkyl groups. (Hereinafter, referred to as the same.)

Examples of the alkoxy groups containing a linear, branched or cyclic alkyl group having 1 to 20 carbon atoms represented by R of $Ar_1$, and the substituents on $Ar_2$ include methoxy group, ethoxy group, n-propyloxy group, iso-propyloxy group, n-butoxy group, iso-butoxy group, tert-butoxy group, pentyloxy group, hexyloxy group, heptyloxy group, octyloxy group, nonyloxy group, decyloxy group, lauryloxy group, cyclopropyloxy group, cyclobutyloxy group, cyclopentyloxy group, cyclohexyloxy group, cycloheptyloxy group, and the like. Pentyloxy group, hexyloxy group, octyloxy group, decyloxy group, and cyclohexyloxy group are suitable.

Examples of the alkylthio groups containing a linear, branched or cyclic alkyl group having 1 to 20 carbon atoms represented by R of $Ar_1$, and the substituents on $Ar_2$ include methylthio group, ethylthio group, n-propylthio group, iso-propylthio group, n-butylthio group, iso-butylthio group, tert-butylthio group, pentylthio group, hexylthio group, heptylthio group, octylthio group, nonylthio group, decylthio group, laurylthio group, cyclopropylthio group, cyclobutylthio group, cyclopentylthio group, cyclohexylthio group, cycloheptylthio group, and the like.

Pentylthio group, hexylthio group, octylthio group, decylthio group, and cyclohexylthio group are suitable.

Examples of the linear, branched or cyclic alkylsilyl group having 1–60 carbon atoms include monomethylsilyl group, dimethylsilyl group, trimethylsilyl group, monoethylsilyl group, diethylsilyl group, triethylsilyl group, monopropylsilyl group, dipropylsilyl group, tripropylsilyl group, monobutylsilyl group, dibutylsilyl group, tributylsilyl group, monopentylsilyl group, dipentylsilyl group, tripentylsilyl group, monohexylsilyl group, dihexylsilyl group, trihexylsilyl group, monoheptylsilyl group, diheptylsilyl group, triheptylsilyl group, monooctylsilyl group, dioctylsilyl group, monooctylsilyl group, dioctylsilyl group, trioctylsilyl group, mononoctylsilyl group, dinonylsilyl group, trinonylsilyl group, monodecylsilyl group, didecylsilyl group, tridecylsilyl group, monolaurylsilyl group, dilaurylsilyl group, trilaurylsilyl group, ethyldimethylsilyl group, propyldimethylsilyl group, butyldimethylsilyl group, pentyldimethylsilyl group, hexyldimethylsilyl group, heptyldimethylsilyl group, octyldimethylsilyl group, nonyldimethylsilyl group, decyldimethylsilyl group, lauryldimethylsilyl group, and the like.

Among them, tripentylsilyl group, trihexylsilyl group, trioctylsilyl group, tridecylsilyl group, pentyldimethylsilyl group, hexyldimethylsilyl group, octyldimethylsilyl group, and decyldimethylsilyl group are suitable.

Examples of the mono- or di-alkylamino group having 1–40 carbon atoms include monomethylamino group, dimethylamino group, mono ethylamino group, diethylamino group, monopropylamino group, dipropylamino group, monobutylamino group, dibutylamino group, monopentylamino group, dipentylamino group, monohexylamino group, dihexylamino group, monoheptylamino group, diheptylamino group, monooctylamino group, dioctylamino group, monononylamino group, dinonylamino group, monodecylamino group, didecylamino group, monolaurylamino group, dilaurylamino group, and the like. Among them, pentylamino group, hexylamino group, octylamino group, decylamino group, dipentylamino group, dihexylamino group, dioctylamino group, and didecylamino group are suitable.

Examples of the aryl group having 6–60 carbon atoms include phenyl group, $C_1$–$C_{12}$ alkoxyphenyl group ($C_1$–$C_{12}$ represents that the number of carbon atoms are 1–12. Hereinafter, referred to as the same.), $C_1$–$C_{12}$ alkylphenyl group, 1-naphthyl group, 2-naphthyl group, and the like. Among them, $C_1$–$C_{12}$ alkoxyphenyl group, and $C_1$–$C_{12}$ alkylphenyl group are suitable.

Examples of the aryloxy group having 6–60 carbon atoms include phenoxy group, $C_1$–$C_{12}$ alkoxyphenoxy group, $C_1$–$C_{12}$ alkylphenoxy group, 1-naphthyloxy group, 2-naphthyloxy group, and the like. Among them, $C_1$–$C_{12}$ alkoxyphenoxy group, and $C_1$–$C_{12}$ alkylphenoxy group are suitable.

Examples of the arylalkyl group having 7–60 carbon atoms include phenyl-$C_1$–$C_{12}$ alkyl group, $C_1$–$C_{12}$ alkoxyphenyl-$C_1$–$C_{12}$ alkyl group, $C_1$–$C_{12}$ alkylphenyl-$C_1$–$C_{12}$ alkyl group, 1-naphthyl-$C_1$–$C_{12}$ alkyl group, 2-naphthyl-$C_1$–$C_{12}$ alkyl group, and the like. Among them, $C_1$–$C_{12}$ alkoxyphenyl-$C_1$–$C_{12}$ alkyl group, and $C_1$–$C_{12}$ alkylphenyl-$C_1$–$C_{12}$ alkyl group are suitable.

Examples of the arylalkoxy group having 7–60 carbon atoms include phenyl-$C_1$–$C_{12}$ alkoxy group, $C_1$–$C_{12}$ alkoxyphenyl-$C_1$–$C_{12}$ alkoxy group, $C_1$–$C_{12}$ alkylphenyl-$C_1$–$C_{12}$ alkoxy group, 1-naphthyl-$C_1$–$C_{12}$ alkoxy group, 2-naphthyl-$C_1$–$C_{12}$ alkoxy group, and the like. Among them, $C_1$–$C_{12}$ alkoxyphenyl-$C_1$–$C_{12}$ alkoxy group, and $C_1$–$C_{12}$ alkylphenyl-$C_1$–$C_{12}$ alkoxy group are suitable.

As an arylalkenyl group having 8–60 carbon atoms, phenylethenyl group, naphthylethenyl group, anthrylethenyl group, pyrenylethenyl group, etc. are exemplified. These may have further $C_1$–$C_{12}$ alkyl group, $C_1$–$C_{12}$ alkoxy group, and $C_6$–$C_{20}$ aryl group as a substituent. Among them, phenylethenyl group, phenylethenyl group having $C_1$–$C_{12}$ alkoxy group, and the phenylethenyl group having $C_1$–$C_{12}$ alkyl group are suitable.

As an arylalkynyl group having 8–60 carbon atoms, phenylethynyl group, naphthylethynyl group, anthrylethynyl group, pyrenylethynyl group, etc. are exemplified. These may have further $C_1$–$C_{12}$ alkyl group, $C_1$–$C_{12}$ alkoxy group, and $C_6$–$C_{20}$ aryl group substituent. Phenyl ethynyl group, phenylethynyl group having $C_1$–$C_{12}$ alkoxy group, and phenylethynyl group having $C_1$–$C_{12}$ alkyl group are suitable.

Examples of the mono-arylamino group having 6–60 carbon atoms include monophenylamino group, $C_1$–$C_{12}$ alkyl-phenylamino group, mono-naphthylamino group, $C_1$–$C_{12}$ alkyl-naphthylamino group, and the like. These may have further $C_1$–$C_{12}$ alkyl group, $C_1$–$C_{12}$ alkoxy group, and $C_6$–$C_{20}$ aryl group as a substituent. Among them, monophenylamino group and $C_1$–$C_{12}$ alkyl-phenylamino group are suitable.

Examples of the di-arylamino group having 6–60 carbon atoms include diphenylamino group, dinaphthylamino group, phenylnaphthylamino group, and the like. These may have further $C_1$–$C_{12}$ alkyl group, $C_1$–$C_{12}$ alkoxy group, and $C_6$–$C_{20}$ aryl group as a substituent. Among them, diphenylamino group having $C_1$–$C_{12}$ alkyl group as a substituent is suitable.

When $Ar_2$ is an aryl group, diphenylamino group is not included as the above example.

As a heterocyclic compound group having 2–60 carbon atoms, pyrrolyl group, oxazolyl group, isoxazolyl group, thiazolyl group, isothiazolyl group, pyranyl group, pyridyl group, pyridazinyl group, pyrimidyl group, pyrazyl group, quinolyl group, oxazyl group, dioxazyl group, indolyl group, isoindolyl group, indazolyl group, chromenyl group, quinolyl group, isoquinolyl group, cinnolyl group, quinazolyl group, quinoxalyl group, phthalazyl group, purinyl group, pteridyl group, xanthenyl group, carbazolyl group, phenanthridyl group, acridyl group, phenazinyl group, phenanthrolinyl group, thianaphthalenyl group, dithianaphthalenyl group, furyl group, benzofuryl group, dibenzofuryl group, thienyl group, benzothienyl group, dibenzothienyl group, oxadiazolyl group, oxazolyl group, triazolylgroup, thiodiazolyl group, benzoxazolyl group, benzodiazolyl group, silolyl group, benzosilolylgroup, etc. are exemplified. These may have further $C_1$–$C_{12}$ alkyl group, $C_1$–$C_{12}$ alkoxy group, and $C_6$–$C_{20}$ aryl group as a substituent. A heterocyclic compound group having 4–60 carbon atoms is preferable, and more preferably, a heterocyclic compound group having 4–30 carbon atoms. Thienyl group, thienyl group having $C_1$–$C_{12}$ alkyl group, pyridyl group, and pyridyl group having $C_1$–$C_{12}$ alkyl group is suitable.

Among the examples of substituents of $Ar_1$ and $Ar_2$, the substituent containing an alkyl chain can be either of linear, branched, or cyclic one, or the combination thereof. When it is not linear, exemplified are isoamyl group, 2-ethylhexyl group, 3,7-dimethyloctyl group, cyclohexyl group, 4-$C_1$–$C_{12}$ alkylcyclohexyl group, and the like. In order to improve the solubility to solvent of a polymeric fluorescent substance, it is suitable that a cyclic or branched alkyl chain is contained in one of the substituents of $Ar_1$ and $Ar_2$. Moreover, the terminal ends of two alkyl chains can be connected to form a ring. Furthermore, carbon atoms of a part of alkyl chain may be replaced by a group containing a hetero atom. Examples of the hetero atoms include an oxygen atom, a sulfur atom, a nitrogen atom, and the like.

Furthermore, among the examples of substituents of $Ar_1$ and $Ar_2$, when an aryl group or a heterocyclic compound group is contained in the part, they can contain one or more substituents.

In the above formula (1), the symbol m is 0 or 1. $R_3$, $R_4$, $R_5$ represent each independently, a group selected from a hydrogen atom, a linear, branched or cyclic alkyl group having 1–20 carbon atoms, an aryl group having 6–60 carbon atoms, a heterocyclic compound group having 2–60 carbon atoms and a cyano group. The aryl group and the heterocyclic compound group may have substituents.

When $R_1$–$R_{11}$ are substituents other than a hydrogen atom or a cyano group, examples of the linear, branched or cyclic alkyl group having 1–20 carbon atoms include methyl group, ethyl group, n-propyl group, iso-propyl group, n-butyl group, iso-butyl group, tert-butyl group, pentyl group, hexyl group, heptyl group, octyl group, nonyl group, decyl group, lauryl group, cyclopropyl group, cyclobutyl group, cyclopentyl group, cyclohexyl group, cycloheptyl group, cyclooctyl group, cyclononyl group, cyclododecyl group, and the like. Among them, pentyl group, hexyl group, octyl group, decyl group, and cyclohexyl group are suitable.

Examples of the aryl group having 6–60 carbon atoms include phenyl group, $C_1$–$C_{12}$ alkoxyphenyl group, $C_1$–$C_{12}$ alkylphenyl group, 1-naphthyl group, 2-naphthyl group, and the like. Among them, phenyl group, and $C_1$–$C_{12}$ alkylphenyl group are suitable.

As a heterocyclic compound group having 2–60 carbon atoms, pyrrolyl group, oxazolyl group, isoxazolyl group, thiazolyl group, isothiazolyl group, pyranyl group, pyridyl group, pyridazinyl group, pyrimidyl group, pyrazyl group, quinolyl group, oxazyl group, dioxazyl group, indolyl group, isoindolyl group, indazolyl group, chromenyl group, quinolyl group, isoquinolyl group, cinnolyl group, quinazolyl group, quiozalyl group, phthalazyl group, purinyl group, pteridyl group, xanthenyl group, carbazolyl group, phenanthridyl group, acridyl group, phenazinyl group, phenanthrolinyl group, thianaphthalenyl group, dithianaphthalenyl group, furyl group, benzofuryl group, dibenzofuryl group, thienyl group, benzothienyl group, dibenzothienyl group, oxadiazolyl group, oxazolyl group, triazolylgroup, thiodiazolyl group, benzoxazolyl group, benzodiazolyl group, silolyl group, benzosilolylgroup, etc. are exemplified. These may have further $C_1$–$C_{12}$ alkyl group, $C_1$–$C_{12}$ alkoxy group, and $C_6$–$C_{20}$ aryl group as a substituent. A heterocyclic compound group having 4–60 carbon atoms is preferable, and more preferably, a heterocyclic compound group having 4–30 carbon atoms. Thienyl group, thienyl group having $C_1$–$C_{12}$ alkyl group, pyridyl group, and pyridyl group having $C_1$–$C_{12}$ alkyl group is suitable.

Moreover, as for the end group of a polymeric fluorescent substance, if the polymerizable group remains as it is, the light-emitting property and lifetime of a device using thereof may fall, and it can be protected by a stable group.

Preferable is a conjugated bond successively connected to the conjugated structure of a main chain. For example, structures bonding to an aryl group or a heterocyclic compound group through vinylene group are included. Specifically, a substituent such as the chemical formula 10 described in JP-A 9-45478 is exemplified.

For synthesizing this polymeric fluorescent substance, when the main chain has vinylene groups, there are exemplified methods described in JP-A No. 5-202355. Namely, there are exemplified polymerization of dialdehyde compounds with diphosphonium salt compounds, polymerization of dialdehyde compounds with bisphosphate ester compounds by Wittig reaction such as Horner-Wadsworth-Emmons method, condensation polymerization by dehydrogenation method of a compound having two methyl halide groups, condensation polymerization by sulfonium salt decomposition method of a compound having two sulfonium base group, polymerization of dialdehyde compounds with diacetonitrile compounds or of compounds having both of aldehyde and acetonitrile groups by the Knoevenagel reaction, and the like. Among them, polymerization by Wittig reaction, condensation polymerization by dehydrohalogenation method and condensation polymerization by sulfonium salt decomposition method are easy to conduct, as described in JP-A-3-244630.

Further, when the main chain does not have a vinylene group, there are exemplified a method in which polymerization is conducted from the corresponding monomer by the Suzuki coupling reaction, a method in which polymerization is conducted by the Grignard reaction, a method in which polymerization is conducted using a Ni(0) catalyst, a method in which polymerization is conducted using an oxidizing agents such as $FeCl_3$ and the like, a method in which oxidation polymerization is conducted electrochemically, a method in which an intermediate polymer having a suitable releasing group is decomposed, and the like.

This polymeric fluorescent substance may contain other repeating unit than the repeating unit of the formulae (1) or (2) in the range wherein luminescent property and charge transport property do not deteriorate. The repeating unit of the formulae (1), (2) or other unit than the repeating unit of the formulae (1) or (2) may be connected via a non-conjugated unit, or such non-conjugated part may also contained in the repeating unit. As the linkage structure, there are exemplified those shown in the following chemical formula 21, combinations of those shown in the following chemical formula 21 with a vinylene group, combinations of two or more of those shown in the following chemical formula 21, and the like. Herein, R's each independently represents a group selected from the group exemplified above, and Ar represents a hydrocarbon group of 6 to 60 carbon atoms. Specific examples of these groups are the same as those exemplified above.

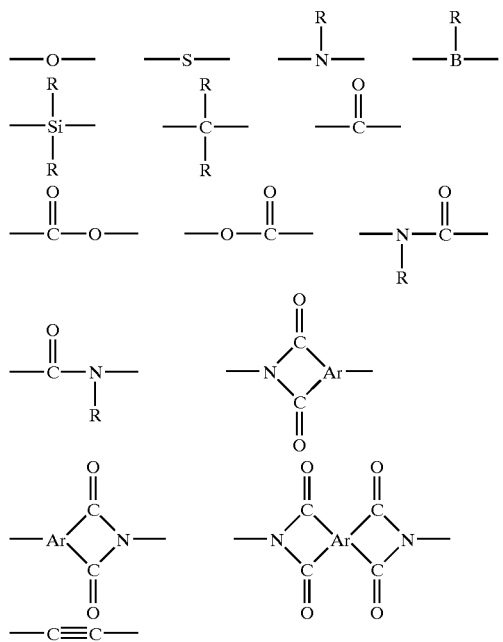

This polymeric fluorescent substance may also be a random, block or graft copolymer, or a polymer having an intermediate structure thereof, for example, a random copolymer having blocking property. From the viewpoint for obtaining a polymeric fluorescent substance having high fluorescent quantum yield, random copolymers having blocking property and block or graft copolymers are more preferable than complete random copolymers. Dendrimers or copolymers having branching in the main chain and having three or more terminals are also included.

Further, as the polymeric fluorescent substance, those emitting fluorescence in a solid state are suitably used, since the material utilizes light emission from a thin film.

As good solvents for the polymeric fluorescent substance, there are exemplified chloroform, methylene chloride, dichloroethane, tetrahydrofuran, toluene, xylene, mesitylene, tetralin, decalin, n-butylbenzene and the like. The polymeric fluorescent substance can be usually dissolved in these solvents in an amount of 0.1 wt % or more, though the amount differs depending on the structure and molecular weight of the polymeric fluorescent substance.

The polymeric fluorescent substance has a number-average molecular weight of $1 \times 10^3$ to $1 \times 10^8$ in terms of polystyrene, and the degree of polymerization thereof also changes depending on repeating structures and proportion thereof. From the standpoint of film forming property, generally the total amount of repeating structures is preferably from 20 to 10000, more preferably from 30 to 10000, particularly preferably from 50 to 5000.

When these polymeric fluorescent substances are used as a light-emitting material of a polymer LED, the purity thereof exerts an influence on light-emitting property, therefore, it is preferable that a monomer before polymerization is purified by a method such as distillation, sublimation purification, re-crystallization and the like before being polymerized and further, it is preferable to conduct a purification treatment such as re-precipitation purification, chromatographic separation and the like after the synthesis.

Next, the polymer LED of the present invention will be illustrated. The polymer LED of the present invention is a polymer LED comprising a pair of electrodes composed of an anode and a cathode at least one of which is transparent or semitransparent and a light-emitting layer disposed between the electrodes, and a polymeric fluorescent substance of the present invention is contained in the light-emitting layer.

As the polymer LED of the present invention, there are listed polymer LEDs having an electron-transporting layer disposed between a cathode and a light-emitting layer, polymer LEDs having a hole-transporting layer disposed between an anode and a light-emitting layer, polymer LEDs having an electron-transporting layer disposed between a cathode and a light-emitting layer and having a hole-transporting layer disposed between an anode and a light-emitting layer.

For example, the following structures a) to d) are specifically exemplified.

a) anode/light-emitting layer/cathode b) anode/hole-transporting layer/light-emitting layer/cathode c) anode/light-emitting layer/electron-transporting layer//cathode d) anode/hole-transporting layer/light-emitting layer/electron-transporting layer/cathode (wherein, "/" indicates adjacent lamination of layers. Hereinafter, referred to as the same)

Herein, the light-emitting layer is a layer having function to emit a light, the hole-transporting layer is a layer having function to transport a hole, and the electron-transporting layer is a layer having function to transport an electron. Herein, the electron-transporting layer and the hole-transporting layer are generically called a charge-transporting layer.

The light-emitting layer, hole-transporting layer and electron-transporting layer may also each independently used in two or more layers.

Of charge-transporting layers disposed adjacent to an electrode, that having function to improve charge-injecting efficiency from the electrode and having effect to decrease driving voltage of an device are particularly called sometimes a charge-injecting layer (hole-injecting layer, electron-injecting layer) in general.

For enhancing adherence with an electrode and improving charge injection from an electrode, the above-described charge-injecting layer or insulation layer having a thickness of 2 nm or less may also be provided adjacent to an electrode, and further, for enhancing adherence of the interface, preventing mixing and the like, a thin buffer layer may also be inserted into the interface of a charge-transporting layer and light-emitting layer.

The order and number of layers laminated and the thickness of each layer can be appropriately applied while considering light-emitting efficiency and life of the device.

In the present invention, as the polymer LED having a charge-injecting layer (electron-injecting layer, hole-injecting layer) provided, there are listed a polymer LED having a charge-injecting layer provided adjacent to a cathode and a polymer LED having a charge-injecting layer provided adjacent to an anode.

For example, the following structures e) to p) are specifically exemplified.

e) anode/charge-injecting layer/light-emitting layer/cathode f) anode/light-emitting layer/charge injecting layer/cathode g) anode/charge-injecting layer/light-emitting layer/charge-injecting layer/cathode h) anode/charge-injecting layer/hole-transporting layer/light-emitting layer/cathode i) anode/hole-transporting layer/light-emitting layer/charge-injecting layer/cathode j) anode/charge-injecting layer/hole-transporting layer/light-emitting layer/charge-injecting layer/cathode k) anode/charge-injecting layer/light-emitting layer/electron-transporting layer/cathode l) anode/light-emitting layer/electron-transporting layer/charge-injecting layer/cathode m) anode/charge-injecting layer/light-emitting layer/electron-transporting layer/charge-injecting layer/cathode n) anode/charge-injecting layer/hole-transporting layer/light-emitting layer/electron-transporting layer/cathode o) anode/hole-transporting layer/light-emitting layer/electron-transporting layer/charge-injecting layer/cathode p) anode/charge-injecting layer/hole-transporting layer/light-emitting layer/electron-transporting layer/charge-injecting layer/cathode As the specific examples of the charge-injecting layer, there are exemplified layers containing a conducting polymer, layers which are disposed between an anode and a hole-transporting layer and contain a material having an ionization potential between the ionization potential of an anode material and the ionization potential of a hole-transporting material contained in the hole-transporting layer, layers which are disposed between a cathode and an electron-transporting layer and contain a material having an electron affinity between the electron affinity of a cathode material and the electron affinity of an electron-transporting material contained in the electron-transporting layer, and the like.

When the above-described charge-injecting layer is a layer containing a conducting polymer, the electric conductivity of the conducting polymer is preferably $10^{-5}$ S/cm or more and $10^3$ S/cm or less, and for decreasing the leak current between light-emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole-injecting layer and a cation is used in an electron-injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge-injecting layer is for example, from 1 nm to 100 nm, preferably from 2 nm to 50 nm.

Materials used in the charge-injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light-emitting layer/cathode r) anode/light-emitting layer/insulation layer having a thickness of 2 nm or less/cathode s) anode/insulation layer having a thickness of 2 nm or less/light-emitting layer/insulation layer having a thickness of 2 nm or less/cathode t) anode/insulation layer having a thickness of 2 nm or less/hole-transporting layer/light-emitting layer/cathode u) anode/hole-transporting layer/light-emitting layer/insulation layer having a thickness of 2 nm or less/cathode v) anode/insulation layer having a thickness of 2 nm or less/hole-transporting layer/light-emitting layer/insulation layer having a thickness of 2 nm or less/cathode w) anode/insulation layer having a thickness of 2 nm or less/light-emitting layer/electron-transporting layer/cathode x) anode/light-emitting layer/electron-transporting layer/insulation layer having a thickness of 2 nm or less/cathode y) anode/insulation layer having a thickness of 2 nm or less/light-emitting layer/electron-transporting layer/insulation layer having a thickness of 2 nm or less/cathode z) anode/insulation layer having a thickness of 2 nm or less/hole-transporting layer/light-emitting layer/electron-transporting layer/cathode aa) anode/hole-transporting layer/light-emitting layer/electron-transporting layer/insulation layer having a thickness of 2 nm or less/cathode ab) anode/insulation layer having a thickness of 2 nm or less/hole-transporting layer/light-emitting layer/electron-transporting layer/insulation layer having a thickness of 2 nm or less/cathode In producing a polymer LED, when a film is formed from a solution by using such polymeric fluorescent substance soluble in an organic solvent, only required is removal of the solvent by drying after coating of this solution, and even in the case of mixing of a charge-transporting material and a light-emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light-emitting layer, the optimum value differs depending on material used, and may properly be selected so that the driving voltage and the light-emitting efficiency become optimum values, and for example, it is from 1 nm to 1 μm, preferably from 2 nm to 500 nm, further preferably from 5 nm to 200 nm.

In the polymer LED of the present invention, light-emitting materials other than the above-described polymeric fluorescent substance can also be mixed in a light-emitting layer. Further, in the polymer LED of the present invention, the light-emitting layer containing light-emitting materials other than the above-described polymeric fluorescent substance may also be laminated with a light-emitting layer containing the above-described polymeric fluorescent substance.

As the light-emitting material, known materials can be used. In a compound having lower molecular weight, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole-transporting layer, as the hole-transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole-transporting material include those described in JP-A Nos. 63-70257, 63-175860, 2-135359, 2-135361, 2-209988, 3-37992 and 3-152184.

Among them, as the hole-transporting materials used in the hole-transporting layer, preferable are polymer hole-transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole-transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole-transporting material having lower molecular weight in the side chain or main chain, since the siloxane skeleton structure has poor hole-transporting property. Particularly, there are exemplified those having an aromatic amine having hole-transporting property in the side chain or main chain.

The method for forming a hole-transporting layer is not restricted, and in the case of a hole-transporting layer having lower molecular weight, a method in which the layer is formed from a mixed solution with a polymer binder is exemplified. In the case of a polymer hole-transporting material, a method in which the layer is formed from a solution is exemplified.

The solvent used for the film forming from a solution is not particularly restricted providing it can dissolve a hole-transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methyl methacrylate), polystyrene, poly(vinyl chloride), polysiloxane and the like are exemplified.

Regarding the thickness of the hole-transporting layer, the optimum value differs depending on material used, and may properly be selected so that the driving voltage and the light-emitting efficiency become optimum values, and at least a thickness at which no pin hole is produced is necessary, and too large thickness is not preferable since the driving voltage of the device increases. Therefore, the thickness of the hole-transporting layer is, for example, from 1 nm to 1 μm, preferably from 2 nm to 500 nm, further preferably from 5 nm to 200 nm.

When the polymer LED of the present invention has an electron-transporting layer, known compounds are used as the electron-transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron-transporting layer is not particularly restricted, and in the case of an electron-transporting material having lower molecular weight, a vapor deposition method from a powder, or a method of film-forming from a solution or melted state is exemplified, and in the case of a polymer electron-transporting material, a method of film-forming from a solution or melted state is exemplified, respectively.

The solvent used in the film-forming from a solution is not particularly restricted provided it can dissolve electron-transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron-transporting layer, the optimum value differs depending on material used, and may properly be selected so that the driving voltage and the light-emitting efficiency become optimum values, and at least a thickness at which no pin hole is produced is necessary, and too large thickness is not preferable since the driving voltage of the device increases. Therefore, the thickness of the electron-transporting layer is, for example, from 1 nm to 1 $\mu$m, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that an anode is transparent or semitransparent, and as the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium.tin.oxide (ITO), indium.zinc.oxide and the like, which are metal oxide complexes, and gold, platinum, silver, copper and the like are used, and among them, ITO, indium.zinc.oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 $\mu$m, preferably from 20 nm to 1 $\mu$m, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 nm to 10 $\mu$m, preferably from 20 nm to 1 $\mu$m, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with a device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light-emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric fluorescent substances emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light-emitting device in plane form is a thin self-light-emitting one, and can be suitably used as a sheet light source for back-light of a liquid crystal display, or as a sheet light source for illumination. Further, if a flexible plate is used, it can also be used as a curved light source or a display.

EXAMPLES

The following examples further illustrate the present invention in detail but do not limit the scope thereof.

Herein, regarding the number average molecular weight, a number average molecular weight in terms of polystyrene was measured by gel permeation chromatography (GPC) using chloroform as a solvent.

Example 1

<Synthesis of Polymeric Fluorescent Substance 1>

2.1 g of 2-{4'-(3,7-dimethyloctyloxy)phenyl}oxy-p-xylylene dibromide was dissolved in 120 g of dehydrated THF. The system was purged with nitrogen by bubbling nitrogen through this solution. To this solution was added dropwise at room temperature, a solution prepared previously by dissolving 2.7 g of potassium t-butoxide in 30 ml of dehydrated THF. After the addition, they were reacted by maintaining at room temperature for 7 hours.

After the reaction, the solution was neutralized by addition of acetic acid. This solution was poured into methanol, and the produced precipitate was recovered. This precipitate was washed with ethanol, then, dried under reduced pressure to obtain 0.6 g of a polymer. Then the polymer was dissolved in chloroform, and the solution was poured into ethanol, and the produced precipitate was recovered. This precipitate was washed with ethanol, then, dried under reduced pressure to obtain 0.5 g of a polymer. This polymer is called Polymeric fluorescent substance 1.

Polymeric fluorescent substance 1 had a polystyrene reduced number-average molecular weight of $5.9 \times 10^4$.

<Measurement of Absorption Spectrum and Fluorescent Spectrum, and Evaluation of Quantum Yield of Fluorescence>

Polymeric fluorescent substance 1 could be dissolved in chloroform. 0.2% chloroform solution thereof was spin-coated on a quartz plate to result a thin film of the polymer. UV-Vis absorption spectrum and fluorescent spectrum of the film were measured respectively with using a spectrophotometer (UV 365, produced by Shimadzu Corp.) and a spectrophotometer (850, produced by Hitachi Ltd.).

Quantum yield of fluorescence was determined by a fluorescent spectrum excited at 410 nm. Fluorescent strength was calculated as a relative value of which the area of the fluorescent spectrum plotted on the wave number (horizontal line) was divided by the absorbance at 410 nm.

The result is shown in Table 1.

Comparative Example 1

<Synthesis of Polymeric Fluorescent Substance 2>

2.3 g of 2-methoxy-5-(2-ethylhexyloxy)-p-xylylene dichloride was dissolved in 400 g of dehydrated 1,4-dioxane. The system was purged with nitrogen by bubbling nitrogen through this solution. To this solution was added dropwise, at room temperature, a solution prepared previously by dissolving 4.7 g of potassium t-butoxide in 70 ml of dehydrated THF. After the addition, they were reacted by maintaining at room temperature for 15 hours.

After the reaction, the solution was neutralized by addition of acetic acid. This solution was poured into methanol, and the produced precipitate was recovered. This precipitate was washed with ethanol, then, dried under reduced pressure to obtain 1.0 g of a polymer. Then the polymer was dissolved in THF, and the solution was poured into ethanol, and the produced precipitate was recovered. This precipitate was washed with ethanol, then, dried under reduced pressure to obtain 0.8 g of a polymer. This polymer is called Polymeric fluorescent substance 2. Polymeric fluorescent substance 2 had a polystyrene reduced number-average molecular weight of $1.8 \times 10^5$.

<Measurement of Absorption Spectrum and Fluorescent Spectrum, and Evaluation of Quantum Yield of Fluorescence>

Evaluation was conducted as the same manner with Example 1, except using polymeric fluorescent substance 2 instead of polymeric fluorescent substance 1. The result is shown in Table 1.

The fluorescence of polymeric fluorescent substance 1 (Example 1) was stronger than that of polymeric fluorescent substance 2 (Comparative Example 1).

TABLE 1

|  | Polymeric fluorescent substance | Wave number of fluorescence peak (nm) | Fluorescence strength (a.u.) |
| --- | --- | --- | --- |
| Example 1 | Polymeric fluorescent substance 1 | 548 | 0.42 |
| Comparative Example 1 | Polymeric fluorescent substance 2 | 586 | 0.29 |

Example 2

<Production and Evaluation of Device>

On a glass substrate having an ITO film sputtered thereon in a thickness of 150 nm, a solution of poly(ethylenedioxythiophene)/polystyrene sulfonic acid (Baytron, produced by Bayer AG) was spin-coated to form a film having a thickness of 50 nm, and dried on a hot plate at 120° C. for 10 minutes. Then, a 0.45 wt % chloroform solution of Polymeric fluorescent substance 1 was spin-coated to form a film having a thickness of 60 nm. Further, this was dried under reduced pressure at 80° C. for 1 hour, then, 0.4 nm of lithium fluoride were vapor-deposited as a buffer layer of cathodes, and 25 nm of calcium and 40 nm of aluminum were vapor-deposited as cathodes to provide a polymer LED. The degree of vacuum in any vapor-deposition cases was $1 \times 10^{-6}$ to $8 \times 10^{-6}$ Torr. Voltage was applied on the resulting device to obtain EL light emission from Polymeric fluorescent substance 1. The beginning voltage of light emitting was about 4 V, and the light emitting efficiency was about 0.5 cd/A. The EL peak wavelength coincides with the wave number of fluorescence peak of the thin film of Polymeric fluorescent substance 1, thus EL light emission from Polymeric fluorescent substance 1 was confirmed.

The polymeric fluorescent substance of the present invention exhibits strong fluorescence. A polymer LED using said polymeric fluorescent substance can be prepared easily and exhibits high light emitting efficiency. Therefore, this polymer LED can be used in apparatuses such as a sheet-type light source as a back light, a flat panel display, and the like.

What is claimed is:

1. A polymeric fluorescent substance exhibiting visible fluorescence in solid state, having a polystyrene reduced number-average molecular weight of $1 \times 10^3$ to $1 \times 10^8$, and containing one or more repeating units of the following formula (1), the amount of the repeating units of formula (1) being from more than 9 mol % to 100 mol % based on the total amount of all repeating units, $$—Ar_1—(CR_1=CR_2)_m— \quad (1)$$

wherein, $Ar_1$ represents an arylene group having 6 to 60 carbon atoms participating in the conjugation or a divalent heterocyclic compound group having 2 to 60 carbon atoms participating in the conjugation, each $Ar_1$ independently carrying at least one substituent, wherein, one, and only one, substituents is a substituent represented by the formula (2); m represents 0 or 1; $R_1$ and $R_2$ are independently selected from the group consisting of a hydrogen atom, a linear, branched or cyclic alkyl group having 2 to 20 carbon atoms, an aryl group having 6 to 60 carbon atoms, a heterocyclic compound groups having 2 to 60 carbon atoms and cyano group;

$$—X—Ar_2 \quad (2)$$

wherein, X represents —O—, —S—, or —$SiR_3R_4$—; and $R_3$, $R_4$ are independently selected from the group consisting of a hydrogen atom, a linear, branched or cyclic alkyl group having 1 to 20 carbon atoms, an aryl group having 6 to 60 carbon atoms, a heterocyclic compound groups having 2 to 60 carbon atoms and a cyano group; $Ar_2$ represents a heterocyclic compound group having 2 to 60 carbon atoms participating in the conjugation or an aryl group having 6 to 60 carbon atoms participating in the conjugation and having at least one substituent thereon; the substituents on the aryl group are selected from linear, branched or cyclic alkyl group having 5 to 20 carbon atoms, alkoxy groups carrying a linear, branched or cyclic alkyl group having 1 to 20 carbon atom, alkylthio groups carrying a linear, branched or cyclic alkyl group having 1 to 20 carbon atoms, mono-, di- or tri-alkylsilyl groups having 1 to 60 carbon atoms, mono- or di-alkylamino groups having 1 to 40 carbon atoms, aryl groups having 6 to 60 carbon atoms and having at least one substituent thereon, aryloxy groups having 6 to 60 carbon atoms, arylalkyl groups having 7 to 60 carbon atoms, and arylalkoxy groups having 7 to 60 carbon atoms;

wherein the portion represented by —$CH_3$ in the substituents on the above $Ar_2$ may be replaced with —$SiR_6R_7R_8$, and the portion represented by —$CH_2$— may be replaced with —O—, —S—, or —$SiR_9R_{10}$—, the portion represented by

may be replaced with

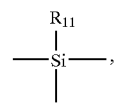

the above $R_6$, $R_7$, $R_8$, $R_9$, $R_{10}$, and $R_{11}$ each independently represent a group selected from a linear, branched or cyclic alkyl group having 1 to 20 carbon atoms, an aryl group having 6 to 20 carbon atoms, a heterocyclic compound group having 2 to 20 carbon atoms, and a cyano group; wherein one or more hydrogen atoms of the substituent on the above $Ar_2$ may be substituted with a fluorine atom; and when a plurality of the substituents are present on $Ar_2$, they may be the same or different.

2. A polymer light emitting device, comprising a pair of electrodes composed of an anode and a cathode at least one of which is transparent or semitransparent, and at least one light emitting layer placed between the electrodes, wherein the polymeric fluorescent substance of claim 1 is contained in said light emitting layer.

3. A flat light source obtained by using the polymer light emitting device of claim 2.

4. A segment display obtained by using the polymer light emitting device of claim 2.

5. A dot matrix display obtained by using the polymer light emitting device of claim 2.

6. A liquid crystal display obtained by using the polymer light emitting device of claim 2 as a back-light.

* * * * *